United States Patent [19]

Shiba

[11] Patent Number: 5,010,381
[45] Date of Patent: Apr. 23, 1991

[54] SEMICONDUCTOR LIGHT RECEIVING ELEMENT

[75] Inventor: Tetsuo Shiba, Itami, Japan

[73] Assignee: Mitsubishi Denki Kabushiki Kaisha, Japan

[21] Appl. No.: 486,354

[22] Filed: Feb. 28, 1990

[30] Foreign Application Priority Data

Aug. 24, 1989 [JP] Japan .................................. 1-219903

[51] Int. Cl.$^5$ ............................................. H01L 27/14
[52] U.S. Cl. .......................................... 357/30; 357/16; 357/58; 437/126; 437/22; 437/154; 437/904
[58] Field of Search ...................... 357/30 A, 30 E, 16, 357/58; 437/3, 5, 16, 22, 20, 904, 96, 126, 154

[56] References Cited

U.S. PATENT DOCUMENTS

| 4,651,187 | 3/1987 | Sugimoto et al. | 357/30 A |
| 4,684,969 | 8/1987 | Taguchi | 357/30 A |
| 4,857,982 | 8/1989 | Forrest | 357/30 A |

FOREIGN PATENT DOCUMENTS 59-28391  2/1984  Japan .............................. 357/30 A

OTHER PUBLICATIONS

"Compound Semiconductor Device Handbook", Science Forum Co., Ltd., 1988, p. 609.

Primary Examiner—William Mintel
Attorney, Agent, or Firm—Leydig, Voit & Mayer

[57] ABSTRACT

A semiconductor light detector for detecting multiple wavelengths of light includes a semiconductor substrate, a plurality of first conductivity type semiconductor layers successively disposed on the semiconductor substrate with increasing energy band gap from the substrate towards a light incident surface of the detector, a first second conductivity type semiconductor region extending from the light incident surface and reaching the first conductivity type layer closest to the surface, and one or more additional second semiconductor regions successively surrounding the first second semiconductor region, reaching the surface and respective first conductivity type semiconductor layers.

15 Claims, 4 Drawing Sheets

SEMICONDUCTOR LIGHT RECEIVING ELEMENT

FIELD OF THE INVENTION

The present invention relates to a semiconductor light detector and, more particularly, to an improvement in a multiple wavelength light detector.

BACKGROUND OF THE INVENTION

FIG. 4 is a cross-sectional view of a prior art multiple wavelength semiconductor light detector.

Reference numeral 1 designates incident light of wavelength $\lambda = 1.3$ microns. Reference numeral 2 designates incident light of wavelength $\lambda = 1.55$ microns. Reference numeral 8 designates an n-type InP substrate. Disposed on the n-type InP substrate 8 is an n-type InGaAsP layer 17 having an energy band gap corresponding to a wavelength of 1.55 microns and a p-type InGaAsP layer 16 having an energy band gap corresponding to a wavelength of 1.55 microns is disposed thereon. A p-type InP window layer 15 is disposed on the p-type InGaAsP layer 16. Disposed on part of the p-type InP window layer 15 is a p-type InGaAsP layer 14 having an energy band gap corresponding to a wavelength of 1.3 microns and an n-type InP window layer 12. A first n side electrode 18 is disposed on the n-type InP window layer 12. A p side electrode 19 disposed on the p-type InP window layer 15 is grounded. A second n side electrode 20 is disposed on the rear surface of the n-type InP substrate 8.

In this structure, n-type and p-type InGaAsP layers 17 and 16, p-type InP window layer 15, p-type and n-type InGaAsP layers 14 and 13, and n-type InP window layer 12 are successively epitaxially grown on the n-type InP substrate 8. Thereafter, the n-type InP window layer 12, n-type InGaAsP layer 13, and p-type InGaAsP layer 14 are etched to produce a mesa-type structure. Two n side electrodes 20 and 18 are respectively produced at the rear surface of the substrate 8 and the surface of the n-type InP window layer 12, respectively, and a p side electrode 19 is produced on the surface of the p-type InP window layer 15.

Light including components at a wavelength $\lambda = 1.3$ microns and a wavelength $\lambda = 1.55$ microns is incident on the surface. The p side electrode 19 is grounded and the first n side electrode 18 and the second n side electrode 20 are respectively biased at positive voltages. The light of wavelength $\lambda = 1.3$ microns transits the n-type InP window layer 12 and, thereafter, is absorbed by the InGaAsP layers 13 and 14, thereby generating charge carriers. In the pn junction between the InGaAsP layers 13 and 14, there is an electric field generated by a voltage applied from the outside. Therefore, the charge carriers generated by the irradiation of light are collected and generate an electromotive force between the first n side electrode 18 and the p side electrode 19. This electromotive force is extracted from the terminal OUT1 as an electrical output signal.

On the other hand, the light of wavelength $\lambda = 1.55$ microns transits the n side InP window layers 12 and 15 and InGaAsP layers 13 and 14 and is absorbed by the InGaAsp layers 16 and 17, thereby generating charge carriers. The charge carriers are output to the external terminal OUT2 as an electrical signal by the same process as described above. Herein, when the InGaAsP layers 13 and 14 are made sufficiently thick, the light of wavelength $\lambda = 1.3$ microns does not pass beyond the respective layers 13 and 14, and only the signal produced by the light of wavelength $\lambda = 1.3$ microns is output from the terminal OUT1 and only the signal produced by the light of wavelength $\lambda = 1.55$ microns is output from the terminal OUT2. Therefore, this element functions as a multiple wavelength light detector.

In the prior art detector, however, the p side electrode 19 has to be connected to an internal layer in a multiple layer structure, the structure is thus complicated, and its production is difficult. Furthermore, matching of the light detector with other elements is more difficult than with a planar detector. In addition, since a crystalline surface is exposed, a surface leakage current flows, thereby reducing reliability.

SUMMARY OF THE INVENTION

It is an object of the present invention to provide a semiconductor light detector having a simple structure and high reliability.

Other objects and advantages of the present invention will become apparent from the detailed description given hereinafter. It should be understood, however, that the detailed description and specific embodiments are given by way of illustration only, since various changes and modifications within the spirit and scope of the invention will become apparent from the detailed description.

According to an aspect of the present invention, a semiconductor light detector includes a first conductivity type first layer of a first semiconductor disposed on a semiconductor substrate, a first conductivity type second layer of a second semiconductor having a larger energy band gap than that of the first semiconductor disposed on the first layer, a second conductivity type first region disposed in the second layer at the surface on which light is incident, and a second conductivity type second region surrounding the first region, not including the first region, and reaching the first layer through the second layer from the surface.

In such a structure, light of different wavelengths is respectively absorbed by the layers having different energy band gaps and by the heterojunction barrier produced between the layers, preventing crosstalk of the generated carriers. Therefore, light of different wavelengths absorbed by the respective layers can be effectively detected. Further, the element structure is planar, resulting in simplified production and good matching with other elements.

According to another aspect of the present invention, a semiconductor light detector is produced by successively growing a first conductivity type first layer of a first semiconductor and a first conductivity type second layer of a second semiconductor having a larger energy band gap than that of the first semiconductor on a semiconductor substrate, producing a second conductivity type first region in the second layer at a surface where light is incident and a second conductivity type annular region spaced a predetermined distance from the first region and penetrating to the second layer from the surface through the first semiconductor layer.

DETAILED DESCRIPTION OF THE PREFERRED EMBODIMENTS

Figure 1:
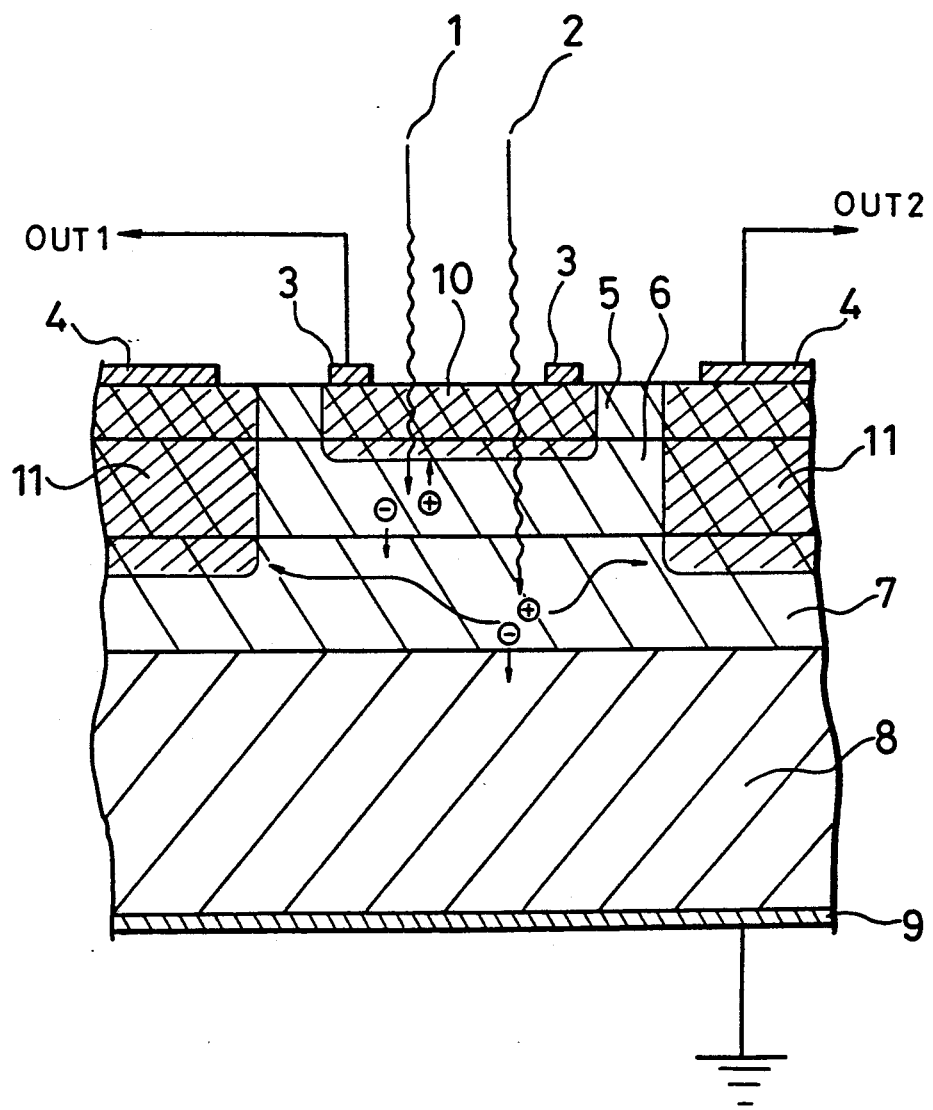
FIG. 1 is a cross-sectional view of a multiple wavelength light detector according to a first embodiment of the present invention.

FIG. 1 shows the structure of a semiconductor light detector according to a first embodiment of the present invention. In FIG. 1, reference numeral 1 designates incident light of wavelength $\lambda = 1.3$ microns. Reference numeral 2 designates incident light of wavelength $\lambda = 1.55$ microns. Reference numeral 8 designates an n-type InP substrate. Disposed on the n-type InP substrate 8 is an n-type InGaAsP layer 7 is having an energy band gap corresponding to a wavelength $\lambda_g = 1.55$ microns. Disposed on the n-type InGaAsP layer 7 is an n-type InGaAsP layer 6 having an energy band corresponding to a wavelength $\lambda_g = 1.3$ microns. An n-type InP window layer 5 is disposed on the n-type InGaAsP layer 6. A first p-type region 10 is disposed in a region of the n-type InP window layer and penetrates to the n-type InGaAsP layer 6. A second p-type region 11 is disposed in the n-type InGaAsP layer 6 and the n-type InP window layer 5 and reaches the n-type InGaAsP layer 7. A first p side electrode 3 is produced on the first p-type region 10 and a second p side electrode 4 is produced on the second p-type region 11. An n side electrode 9 is produced on the rear surface of the n-type InP substrate 8.

On the n-type InP substrate 8, an undoped n-type $In_xGa_{1-x}As_yP_{1-y}$ layer 7, having an energy band gap corresponding to a wavelength $\lambda_g = 1.55$ microns is grown to a thickness of about 2 microns by liquid phase epitaxy or metal organic chemical vapor deposition. Thereafter, by a similar method, an n-type $In_{x'}GA_{1-x'}As_{y'}P_{1-y'}$ layer 6 having an energy band gap corresponding to a wavelength $\lambda_g = 1.3$ microns is grown to a thickness of about 2 microns, and an n-type InP layer 5 as a window layer is grown to a thickness of about 1 micron.

Surrounding the region where the light is incident, zinc is diffused into an annular region which is spaced apart by about 10 to 20 microns from the light collecting region, thereby producing a second p-type region 11 reaching the n-type InGaAsP layer 7 through the n-type InGaAsP layer 6 from the surface.

A first p-type region 10 is produced by diffusing zinc into the light incident region surrounded by the p-type region 11 by a similar method. Finally, an n side electrode 9 comprising Ag/Ge is produced at the rear surface of substrate 8, and p side electrodes 3 and 4 comprising Au/Zn are produced at the surfaces of the first p-type region 10 and the second p-type region 11 to a thickness of several thousand angstroms, thereby completing the light detector.

As described for the prior art device, incident light includes components at wavelengths $\lambda = 1.3$ microns and $\lambda = 1.55$ microns. The n electrode 9 of the light detector is grounded and the p side electrodes 3 and 4 are biased to negative voltages. The light of wavelength $\lambda = 1.3$ microns transits the n-type InP layer 5 and is absorbed by the n-type $In_{x'}GA_{1-x'}As_{y'}P_{1-y'}$ layer 6, thereby producing charge carriers. Since an electric field is generated by the bias applied to the pn junction produced in the InGaAsP layer 6, the charge carriers flow and are collected to generate an electromotive force between the first p side electrode 3 and the n side electrode 9. Since the first p-type region 10 and the second p-type region 11 are separated by about 20 microns while the layer thickness of the n-type $In_{x'}Ga_{1-x'}As_{y'}P_{1-y'}$ layer 6 is about 2 microns, if the incident light is sufficiently collimated on the first p-type region 10, all the generated holes are captured in the first p-type region 10, so that there is no leakage to the second p-type region 11.

The light of wavelength $\lambda = 1.55$ microns transits the n-type InP layer 5 and n-type $In_{x'}Ga_{1-x'}As_{y'}P_{1-y'}$ layer 6 and is absorbed by the n-type $In_{x'}Ga_{1-x'}As_{y'}P_{1-y'}$ layer 7, thereby generating charge carriers. The depletion layer extending from the first p-type region 10 is expanded into the InGaAsP layer 6 by adjusting the external bias but it does not reach the lower InGaAsP layer 7. As an electric field is not applied to the region where carriers are generated in the InGaAsP layer 7, the carriers move by diffusion. On the other hand, since the InGaAsP layer 6 has a larger energy band gap than that of the InGaAsP layer 7, a barrier is produced in the energy band structure at the interface between the InGaAsP layer 6 and the InGaAsP layer 7. The carriers generated in the InGaAsP layer 7 cannot flow to the upper InGaAsP layer 6 because of this barrier. Therefore, holes generated in the InGaAsP layer 7 reach the second p-type region 11 by diffusion. If the carrier concentration in the InGaAsP layer 7 is sufficiently low (for example, about $1 \times 10^{15}$ cm$^{-3}$), the diffusion length of holes in the transverse direction is several tens of microns and almost all the holes can reach the second p-type region 11. In this way, the holes, as minority carriers generated in the InGaAsP layer 7, are almost all captured by the p-type region 11, thereby generating an electromotive force between electrodes 4 and 9.

Based on the above-described operation, the signal corresponding to incident light of wavelength $\lambda = 1.3$ microns is output to the output terminal OUT1, and the signal corresponding to incident light of wavelength $\lambda = 1.55$ microns is output to the output terminal OUT2. Thereby, this element operates as a multiple wavelength light detector.

Figure 2:
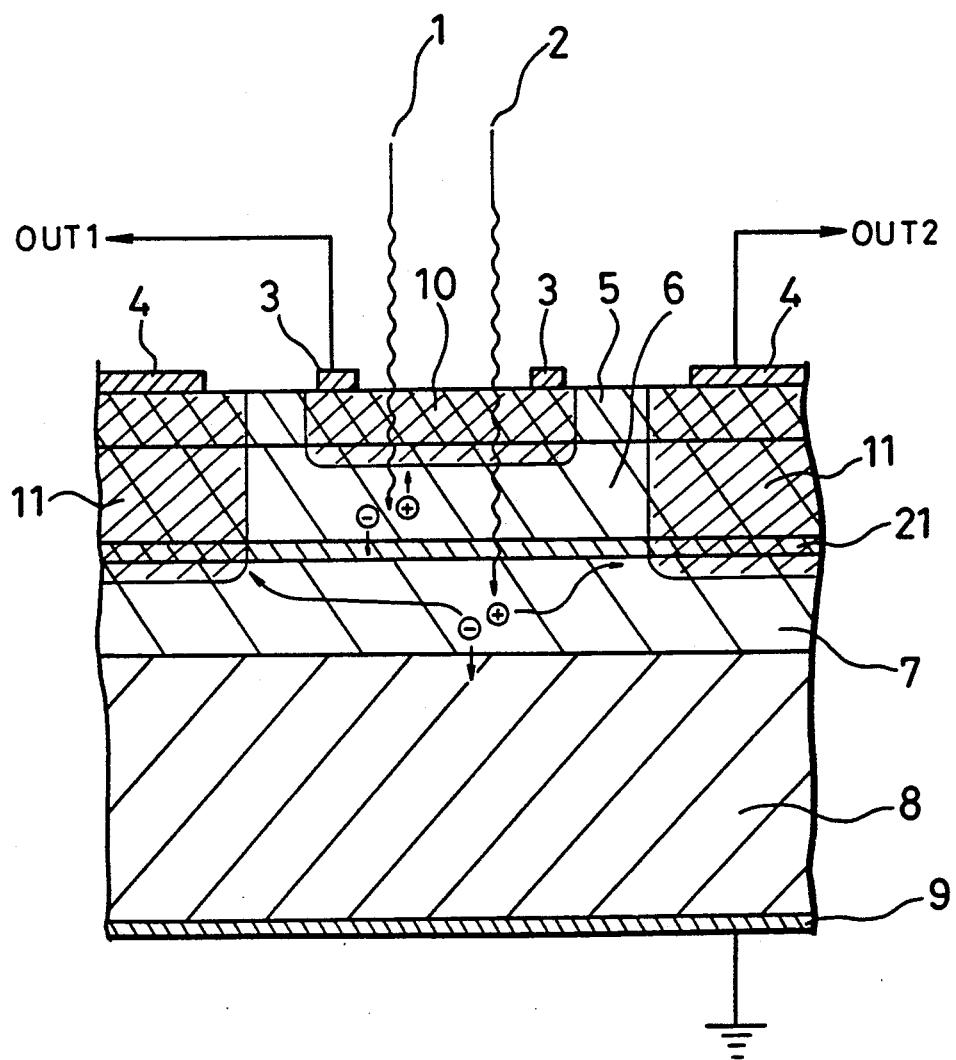
FIG. 2 is a cross-sectional view of a multiple wavelength light detector according to a second embodiment of the present invention.

FIG. 2 shows a structure of a semiconductor light detector according to a second embodiment of the present invention which can exploit the advantages of the above-described embodiment even more.

In FIG. 2, the same reference numerals designate the same or corresponding elements as those shown in FIG. 1. An n-type InP layer 21 having a larger energy band gap than those of the InGaAsP layer 6 and the InGaAsP layer 7 is disposed between layers 6 and 7. By the introduction of this layer 21, the barrier in the energy band structure between the InGaAsp layer 6 and the InGaAsP layer 7 is further increased and mutual intrusion of carriers generated in the InGaAsP layer 6 and in the InGaAsP layer 7 can be effectively prevented.

In the above-described first and second embodiments, a semiconductor light detecting element for detecting two wavelengths of light is described. The present invention, however, is not restricted thereto, and a structure for detecting one wavelength of light mixed in a plurality of wavelengths can also be provided.

Figure 3:
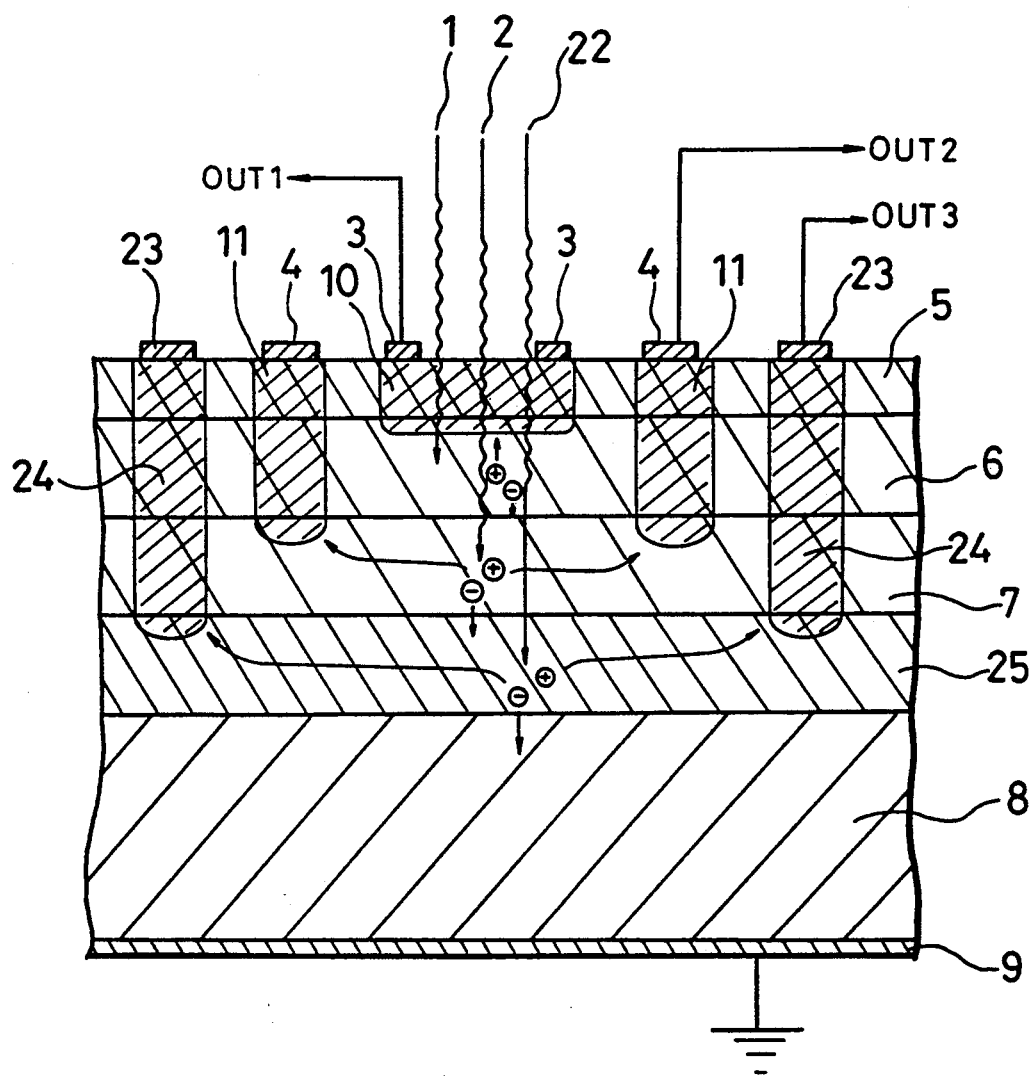
FIG. 3 is a cross-sectional view of a multiple wavelength light detector according to a third embodiment of the present invention.
Figure 4:
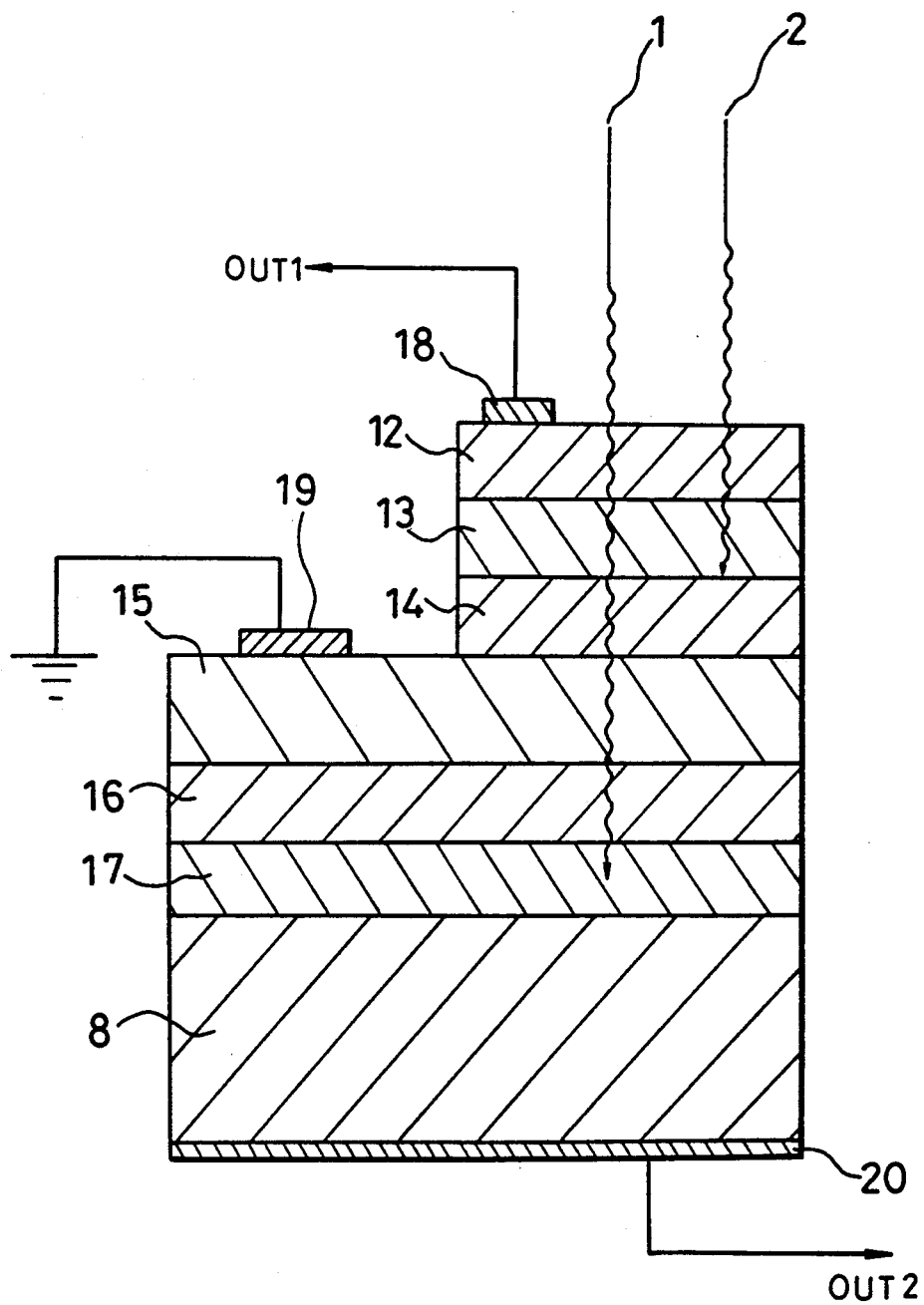
FIG. 4 is a cross-sectional view of a prior art multiple wavelength light detector.

FIG. 3 shows an element for detecting three wavelengths. In the embodiment of FIG. 3, the same reference numerals designate the same or corresponding elements as those shown in FIG. 1. Reference numeral 22 designates incident light having a wavelength longer than 1.55 microns. Reference numeral 25 designates an n-type $In_{x''}Ga_{1-x''}As_{y''}P_{1-y''}$ layer having a smaller energy band gap than the n-type $In_xGa_{1-x}As_yP_{1-y}$ layer 7. Reference numeral 24 designates a p-type region that reaches the n-type $In_{x''}Ga_{1-x''}As_{y''}P_{1-y''}$ layer 25 from the surface of the structure. Reference numeral 23 designates a p side electrode disposed at the surface of the p-type region 24. The operation of this construction is the same as that of the above-described embodiment. The n side electrode 9 of the light detector is grounded, the p-type electrodes 3, 4, and 23 are biased to negative voltages, and the depletion layer extending from the first p-type region 10 is limited to the InGaAsP layer 6 by adjusting the external bias. In this state, when incident light comprising three wavelengths of light is considered, the light of wavelength $\lambda = 1.3$ microns transits the n-type InP layer and is absorbed by the InGaAsP layer 6, thereby producing charge carriers and generating an electromotive force between the first p side electrode 3 and the n side electrode 9. Furthermore, the light of wavelength $\lambda = 1.55$ microns transits the InP layer 5 and the InGaAsP layer 6, is absorbed by the InGaAsP layer 7, and the generated holes reach the second p-type region 11 by diffusion, thereby generating an electromotive force between the electrodes 4 and 9. The light having wavelengths longer than the 1.55 microns transits the InP window layer 5, the InGaAsP layer 6, and the InGaAsP layer 7 and is absorbed by the InGaAsP layer 25. The holes generated there reach the third p-type region 23 by diffusion without reaching the upper InGaAsP layer 7, because they are obstructed by the heterojunction barrier at the interface of the InGaAsP layer 7 and the InGaAsP layer 25, thereby generating an electromotive force only between the electrodes 23 and 9.

When light comprising three wavelengths is incident as described above, first, second, and third n-type InGaAsP layers are successively arranged so that the larger energy band gap layers are positioned closer to the light incident surface and separate p-type regions reach the third, second, and first semiconductor layers from the surface, spaced at constant intervals. The respective light wavelengths are absorbed and detected by the first, second, and third n-type InGaAsP layers successively in the order of increasing wavelength. Therefore, even when a plurality of wavelengths are present in incident light, the respective light wavelengths can be easily detected. Moreover, the production of the detector is simplified because the detector structure is planar.

In the semiconductor light detectors according to the first and third embodiments, the materials are InGaAsP mixed crystals. However, the present invention can be applied to other materials used in a light detector, such as AlGaAs, AlGaSb, and HgCdTe.

As is evident from the foregoing description, according to the present invention, a multiple wavelength light detector includes a plurality of first conductivity type semiconductor layers having different energy band gaps arranged from a light incident surface in decreasing energy band gap order. A first second conductivity type region is disposed at the surface reaching the shallowest first conductivity type semiconductor layer, and one or more second conductivity type regions are disposed successively surrounding the first second conductivity type region at intervals. Therefore, respective light wavelengths can be easily detected from light including a plurality of wavelengths. Matching of the detector with the other elements is improved because the detector is planar. The production of detectors is also simplified. Furthermore, since carrier crosstalk between the respective layers is suppressed by a heterojunction barrier between layers, a highly reliable multiple wavelength light detector is obtained.

What is claimed is:

1. A semiconductor light detector comprising:
    a semiconductor substrate;
    at least two first conductivity type semiconductor layers successively disposed on said semiconductor substrate, each layer having an energy band gap, the energy band gaps of the respective layers increasing from the substrate to the layer most distant from the substrate, the layer most distant from the substrate including a light incident surface;
    a first second conductivity type semiconductor region disposed at the surface extending into the layer most distant from the substrate; and
    a successive second conductivity type semiconductor region corresponding to each first conductivity type layer between the most distant first conductivity type layer and the substrate extending from the surface to the corresponding layer, each successive second conductivity type region being successively disposed more remotely from the first second conductivity type region.

2. A semiconductor light detector as defined in claim 1 including a second first conductivity type semiconductor layer having a larger energy band gap than that of two successive first conductivity type semiconductor layers disposed between and contacting those two successive layers.

3. A semiconductor light detector as defined in claim 1 including a first electrode disposed at the surface of each of said second conductivity type semiconductor regions and a common electrode disposed on said substrate.

4. A semiconductor light detector as defined in claim 1 wherein said substrate and layers are chosen from the group consisting of InGaAsP, AlGaAs, AlGaSb, and HgCdTe.

5. A semiconductor light detector as defined in claim 1 wherein said semiconductor substrate comprises n-type InP, said first conductivity type semiconductor layers comprise n-type InGaAsP, and said second conductivity type regions are p-type regions.

6. A semiconductor light detector comprising:
    a semiconductor substrate;
    a first conductivity type first semiconductor layer having a first energy band gap and disposed on said substrate;
    a first conductivity type second semiconductor layer having a second energy band gap larger than the first energy band gap disposed on said first semiconductor layer and having a surface on which light is incident;
    a second conductivity type first semiconductor region disposed in said second semiconductor layer and extending to the surface; and
    a second conductivity type second semiconductor region spaced from said first semiconductor and extending from the surface to said first semiconductor layer through said second semiconductor layer.

7. A semiconductor light detector as defined in claim 6 including a third semiconductor layer having a larger energy band gap than those of said first and second semiconductor layers disposed between and contacting said first and second semiconductor layers.

8. A semiconductor light detector as defined in claim 6 including first and second electrodes disposed on the surface respectively contacting said first and second semiconductor regions and a common electrode disposed on said substrate.

9. A semiconductor light detector as defined in claim 6 wherein said substrate and layers are chosen from the group consisting of InGaAsP, AlGaAs, AlGaSb, and HgCdTe.

10. A method of making a semiconductor light detector comprising;
depositing a first conductivity type first semiconductor layer and a first conductivity type second semiconductor layer having a larger energy band gap than that of said first semiconductor layer successively on a semiconductor substrate, said second layer having a surface on which light is incident;
producing a second conductivity type first semiconductor region extending from the surface into the second layer; and
producing a second conductivity type annular second semiconductor region spaced from and surrounding said first semiconductor region reaching said first semiconductor layer through said second semiconductor layer from the surface.

11. A semiconductor light detector as defined in claim 6 wherein said semiconductor substrate comprises n-type InP, said first and second semiconductor layers comprise n-type InGaAsP, and said first and second semiconductor regions are p-type regions.

12. A semiconductor light detector as defined in claim 1 wherein said successive second conductivity type regions are annular and surround said first second conductivity type region.

13. A semiconductor light detector comprising:
a semiconductor substrate;
at least two first conductivity semiconductor layers successively disposed on said semiconductor substrate, each layer having an energy band gap, the energy band gaps of the respective layers increasing from the substrate to the layer most distant from the substrate, the layer most distant from the substrate including a light incident surface;
a third first conductivity type semiconductor layer having a larger energy band gap than that of said two successive first conductivity type semiconductor layers and disposed between and contacting those successive layers;
a first second conductivity type semiconductor region disposed at the surface extending into the layer most distant from the substrate; and
a successive second conductivity type semiconductor region corresponding to each first conductivity type layer between the most distant first conductivity type layer and the substrate extending from the surface to the corresponding layer, each successive second conductivity type region being successively disposed more remotely from the first second conductivity type region.

14. A semiconductor light detector comprising:
a semiconductor substrate;
a first conductivity type first semiconductor layer having a first energy band gap and disposed on said substrate;
a first conductivity type second semiconductor layer having a second energy band gap larger than the first energy band gap having a surface on which light is incident;
a third semiconductor layer having a larger energy band gap than those of said first and second semiconductor layers disposed between and contacting said first and second semiconductor layers;
a second conductivity type first semiconductor region disposed in said second semiconductor layer and extending to the surface; and
a second conductivity type second semiconductor region spaced from said first semiconductor region and extending from the surface to said first semiconductor layer through said second semiconductor layer.

15. A semiconductor light detector as defined in claim 6 wherein said second region surrounds said first region.

* * * * *